US007974807B2

(12) United States Patent
Geng et al.

(10) Patent No.: US 7,974,807 B2
(45) Date of Patent: Jul. 5, 2011

(54) ADAPTIVE CALIBRATION FOR DIGITAL PHASE-LOCKED LOOPS

(75) Inventors: Jifeng Geng, San Diego, CA (US); Daniel F. Filipovic, Solana Beach, CA (US); Christos Komninakis, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/233,400

(22) Filed: Sep. 18, 2008

(65) Prior Publication Data
US 2010/0066421 A1 Mar. 18, 2010

(51) Int. Cl.
*G06F 19/00* (2011.01)
(52) U.S. Cl. ............... 702/106; 702/89; 702/189
(58) Field of Classification Search ............... 327/159, 327/162; 331/DIG. 2, 182, 187; 341/131; 375/376, 377; 702/89, 106, 189
See application file for complete search history.

(56) References Cited

U.S. PATENT DOCUMENTS

| 7,183,860 | B2 * | 2/2007 | Staszewski et al. | 375/376 |
| 7,205,924 | B2 | 4/2007 | Vemulapalli et al. | |
| 7,427,940 | B2 | 9/2008 | Staszewski et al. | |
| 7,557,623 | B2 * | 7/2009 | Moehlmann et al. | 327/156 |
| 2006/0103566 | A1 * | 5/2006 | Vemulapalli et al. | 341/155 |
| 2007/0085622 | A1 * | 4/2007 | Wallberg et al. | 331/179 |
| 2008/0043894 | A1 | 2/2008 | Dedieu et al. | |
| 2008/0157839 | A1 | 7/2008 | Staszewski et al. | |
| 2008/0317187 | A1 * | 12/2008 | Waheed et al. | 375/376 |

OTHER PUBLICATIONS

International Search Report & Written Opinion—PCT/US09/057550 International Search Authority—European Patent Office—Jan. 21, 2010.

* cited by examiner

*Primary Examiner* — Michael P Nghiem
*Assistant Examiner* — Elias Desta
(74) *Attorney, Agent, or Firm* — Jonathan T. Velasco

(57) ABSTRACT

Techniques for adaptively calibrating a TDC output signal in a digital phase-locked loop (DPLL). In an exemplary embodiment, a calibration factor multiplied to the TDC output signal is adaptively adjusted to minimize a magnitude function of a phase comparator output signal of the DPLL. In an exemplary embodiment, the calibration factor may be adjusted using an exemplary embodiment of the least-mean squares (LMS) algorithm. Further techniques for simplifying the adaptive algorithm for hardware implementation are described.

28 Claims, 6 Drawing Sheets

ADAPTIVE CALIBRATION FOR DIGITAL PHASE-LOCKED LOOPS

TECHNICAL FIELD

The disclosure relates to the design of digital phase-locked loops (DPLL's), and more specifically, to techniques for adaptively calibrating the output of a time-to-digital converter (TDC) within a DPLL.

BACKGROUND

In modern communications circuitry, digital phase-locked loops (DPLL's) are used to generate modulated or unmodulated carrier signals by phase locking to a reference signal having a known frequency. DPLL's may employ digital or mixed-signal implementations of such PLL blocks as the loop filter, oscillator, and phase discriminator.

One mixed-signal block commonly found in a DPLL is a time-to-digital converter (TDC), which generates digital representations of continuous time interval durations. A TDC generally quantizes the timing difference between a reference signal and a feedback signal in the DPLL, and may be used, for example, to compute a fractional portion of the number of feedback signal cycles elapsing in one or more reference signal cycles. TDC's typically generate a digital output signal expressed in units of TDC buffer delay, which may then be converted to units of feedback phase by multiplying with a TDC calibration factor.

Inaccuracy in computing the TDC calibration factor, coupled with other factors such as TDC quantization error, may generate phase noise or spurs in the DPLL output signal. It would be desirable to have simple and effective techniques for computing the TDC calibration factor to improve DPLL performance.

SUMMARY

An aspect of the present disclosure provides a method for improving the performance of a digital phase-locked loop (DPLL), the DPLL comprising a time-to-digital converter (TDC) for providing a digital representation of the duration of an interval spanning an event in an output signal and an event in a reference signal, the digital representation adjusted by a calibration factor to generate a calibrated TDC output signal, the DPLL further comprising a comparator for comparing a target phase with an accumulated phase of the output signal to generate a phase comparator output signal, the accumulated phase of the output signal comprising the calibrated TDC output signal, the method comprising: adjusting the calibration factor to decrease a magnitude function of the phase comparator output signal.

Another aspect of the present disclosure provides a digital phase-locked loop (DPLL) comprising a time-to-digital converter (TDC) for providing a digital representation of the duration of an interval spanning an event in an output signal and an event in a reference signal, the digital representation adjusted by a calibration factor to generate a calibrated TDC output signal, the DPLL further comprising a comparator for comparing a target phase with an accumulated phase of the output signal to generate a phase comparator output signal, the accumulated phase of the output signal comprising the calibrated TDC output signal, the DPLL further comprising: an adaptive error minimization block configured to adjust the calibration factor to decrease a magnitude function of the phase comparator output signal.

Yet another aspect of the present disclosure provides a digital phase-locked loop (DPLL) comprising a time-to-digital converter (TDC) for providing a digital representation of the duration of an interval spanning an event in an output signal and an event in a reference signal, the digital representation adjusted by a calibration factor to generate a calibrated TDC output signal, the DPLL further comprising a comparator for comparing a target phase with an accumulated phase of the output signal to generate a phase comparator output signal, the accumulated phase of the output signal comprising the calibrated TDC output signal, the DPLL further comprising: means for adaptively decreasing a magnitude function of the phase comparator output signal.

Yet another aspect of the present disclosure provides a computer program product for improving the performance of a digital phase-locked loop (DPLL), the DPLL comprising a time-to-digital converter (TDC) for providing a digital representation of the duration of an interval spanning an event in an output signal and an event in a reference signal, the digital representation adjusted by a calibration factor to generate a calibrated TDC output signal, the DPLL further comprising a comparator for comparing a target phase with an accumulated phase of the output signal to generate a phase comparator output signal, the accumulated phase of the output signal comprising the calibrated TDC output signal, the product comprising: computer-readable medium comprising: code for causing a computer to adjust the calibration factor to decrease a magnitude function of the phase comparator output signal.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Figure 1:
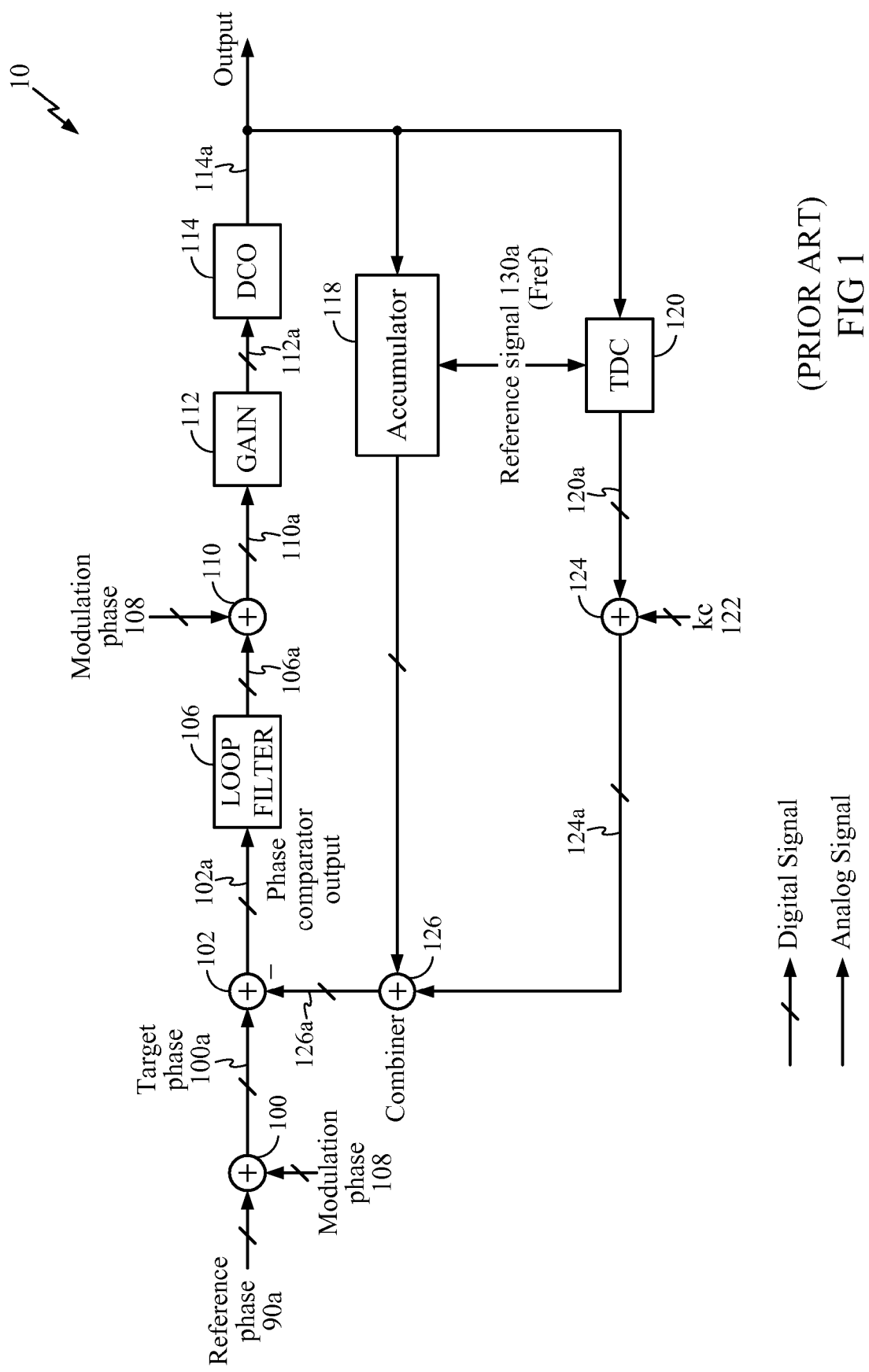
FIG. 1 depicts an implementation of a prior art DPLL 10.

FIG. 1 depicts an implementation of a prior art DPLL 10. The DPLL 10 includes such elements as an accumulator 118, time-to-digital converter (TDC) 120, digital phase comparator 102, digital loop filter 106, and digitally controlled oscillator (DCO) 114. Note the DPLL 10 in FIG. 1 is shown for illustrative purposes only. One of ordinary skill in the art will appreciate that the techniques of the present disclosure may be readily applied to alternative DPLL architectures not shown. For example, a DPLL may incorporate additional filtering or gain elements not shown in FIG. 1. Such exemplary embodiments are contemplated to be within the scope of the present disclosure.

During operation, the DCO 114 generates an output signal 114a having a frequency controlled by a digital input signal 112a. The signal 114a, along with a reference signal 130a, is provided to the accumulator 118 and the TDC 120. In an implementation, the frequency (Fref) of the reference signal 130a may be lower than the frequency of the DCO output signal 114a, in which case an additional frequency divider (not shown) may be provided in the DPLL feedback path. The accumulator 118 and TDC 120 may be configured to periodically measure the cumulative number of cycles of output signal 114a elapsed since a reference time, with the accumulator 118 accumulating the integer portion of the elapsed number of cycles, and the TDC 120 measuring the residual fractional portion. Typically, the TDC output signal 120a is digitally expressed in integer multiples of a TDC buffer delay ($T_D$). The TDC output signal 120a is multiplied 124 by a calibration factor kc 122, before being combined 126 with the accumulator output 118a to form the combiner output 126a. The combiner output 126a represents the measured accumulated phase of the output signal 114a.

In FIG. 1, a target phase 100a is generated by adding a reference phase 90a to a modulation phase 108, which may correspond to information to be modulated onto a carrier signal. The target phase 100a is compared 102 to the combiner output 126a to generate a phase comparator output 102a, which is then provided to a loop filter 106. In the implementation shown, the loop filter output 106a is then added 110 again to the modulation phase 108. The DPLL architecture of FIG. 1 is an example implementation of a "two-point modulation" (TPM) technique known to one of ordinary skill in the art. See, e.g., Staszewski and Balsara, "All-Digital Frequency Synthesizer in Deep-Submicron CMOS," (2006). The adder output 110a is provided to a gain element 112 to generate the signal 112a provided to control the frequency of the DCO output signal 114a.

Note one of ordinary skill in the art will appreciate that in some implementations (not shown), the DPLL may generate unmodulated signals, or may generate signals modulated using techniques other than the TPM technique shown. The techniques of the present disclosure may readily be applied to such alternative implementations.

Figure 2:
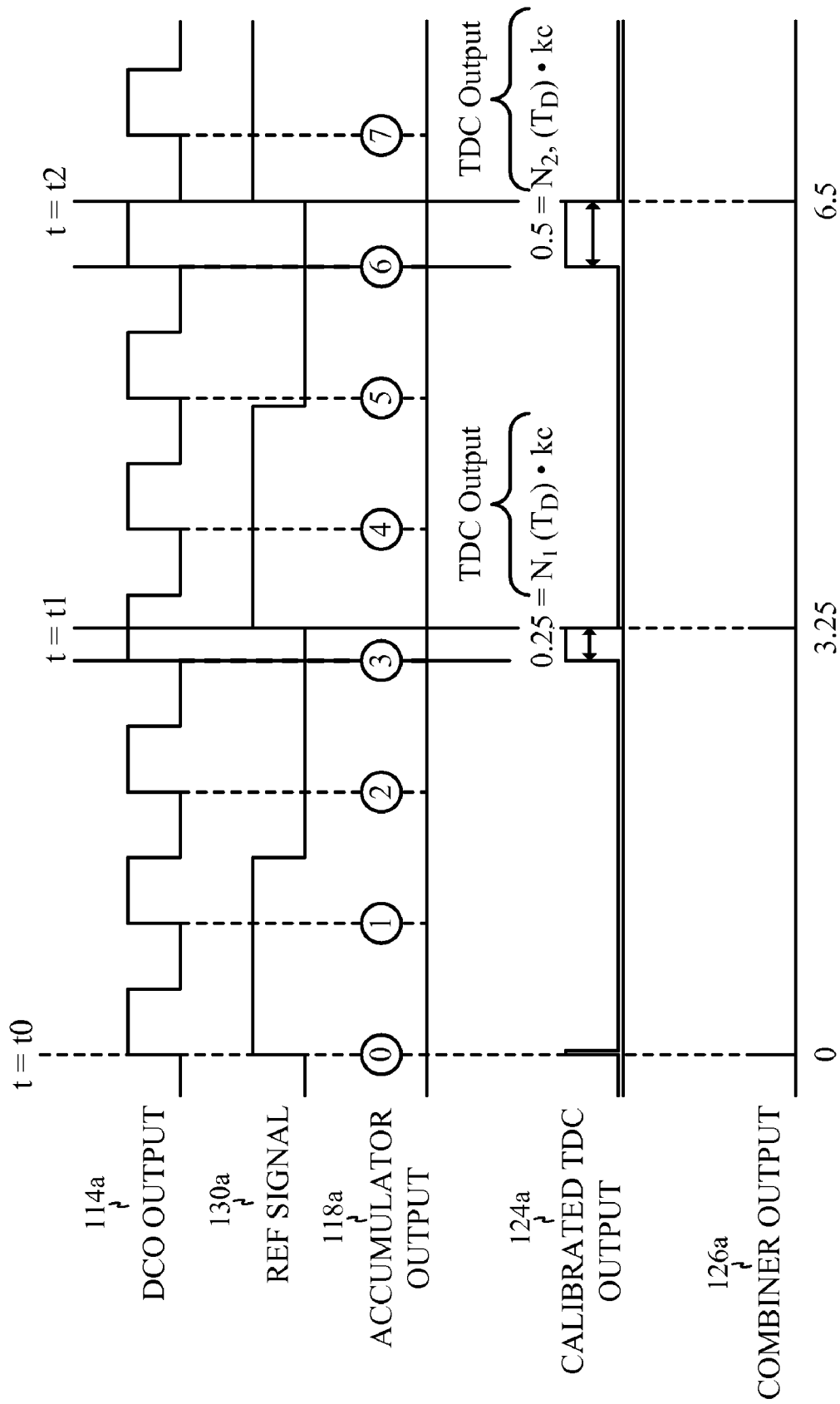
FIG. 2 illustrates examples of signals present in the DPLL 10 during operation.

FIG. 2 illustrates examples of signals present in the DPLL 10 during operation. In FIG. 2, the DCO output signal 114a is shown along with the reference signal 130a. Note the signals shown in FIG. 2 are intended for illustration only, and are not meant to restrict the scope of the present disclosure to any particular relationship of the output signal 114a to the reference signal 130a shown. In alternative exemplary embodiments (not shown), the relative frequency between the output signal 114a and the reference signal 130a may be higher or lower than that shown in FIG. 2. Such exemplary embodiments are contemplated to be within the scope of the present disclosure.

In FIG. 2, accumulator output signal 118a is seen to accumulate the total integer number of cycles of the DCO output signal 114a elapsing since a reference time t=t0. Meanwhile, calibrated TDC output signal 124a is seen to generate, on the rising edge of the reference signal 130a, the time (expressed in cycles of signal 114a) elapsing between a rising edge of the reference signal 130a and the immediately preceding rising edge of the DCO output signal 114a. The combiner output signal 126a combines the accumulator output signal 118a and the calibrated TDC output signal 124a to generate the total accumulated phase of signal 114a.

For example, sampled at time t=t1, the combiner output 126a has an integer portion of 3 according to the accumulator output signal 118a and a fractional portion of 0.25 according to the calibrated TDC output signal 124a, combined for a total output of 3.25 cycles of signal 114a. Similarly, sampled at time t=t2, the combiner output 126a has an integer portion of 6 and a fractional portion of 0.5, combined for a total output of 6.5.

Note one of ordinary skill in the art will appreciate that the total combiner output signal 126a and other signals shown in FIGS. 1 and 2 may be computed in any arbitrary units, and the scope of the present disclosure is not limited to any particular units used to express the signals. For example, the signal 126a may be computed in cycles of the reference signal 130a, or any scaled version of any units shown or not shown in FIG. 2. Such exemplary embodiments are contemplated to be within the scope of the present disclosure.

One of ordinary skill in the art will also appreciate that the DPLL need not be restricted to working with the rising edges of the output and reference signals. In alternative exemplary embodiments (not shown), the techniques of the present disclosure may readily accommodate systems wherein the falling edges of the signals, or a combination of the falling and rising edges, are instead used for sampling. In other exemplary embodiments (not shown), the techniques of the present disclosure may also be readily applied to systems wherein a sampling event of the reference signal precedes, rather than follows, a corresponding event of the output signal. Such alternative exemplary embodiments are contemplated to be within the scope of the present disclosure.

As previously mentioned, to calibrate the units of the TDC output signal 120a, which is usually expressed in integer units of TDC buffer delay, into units of the DCO output signal 114a phase, a calibration factor kc is multiplied to the TDC output signal 120a to generate calibrated TDC output signal 124a. For example, in FIG. 2, the value of the calibrated TDC output signal 124a at time t=t1, 0.25, is seen to correspond to the TDC output $N_1(T_D)$ multiplied by kc, wherein $N_1(T_D)$ is an integer number $N_1$ of the TDC buffer delays $T_D$. Similarly, the value of the calibrated TDC output signal 124a at time t=t2, 0.5, is seen to correspond to the TDC output $N_2(T_D)$ multiplied by kc.

In some implementations, the calibration factor kc may be continuously estimated and updated during DPLL operation to account for the effects of, e.g., temperature and voltage drift and/or variations in characteristics of the manufactured components. To estimate the calibration factor kc, various implementations may compute the average number of TDC buffer delays over a predetermined number of DCO output cycles, e.g., half of a DCO output cycle. One of ordinary skill in the art will appreciate that inaccuracies in estimating the calibration factor kc may result in phase noise and/or spurs in the DCO output signal 114*a*.

The present disclosure describes simple and effective novel techniques for deriving a calibration factor kc' to improve overall DPLL performance.

Figure 3:
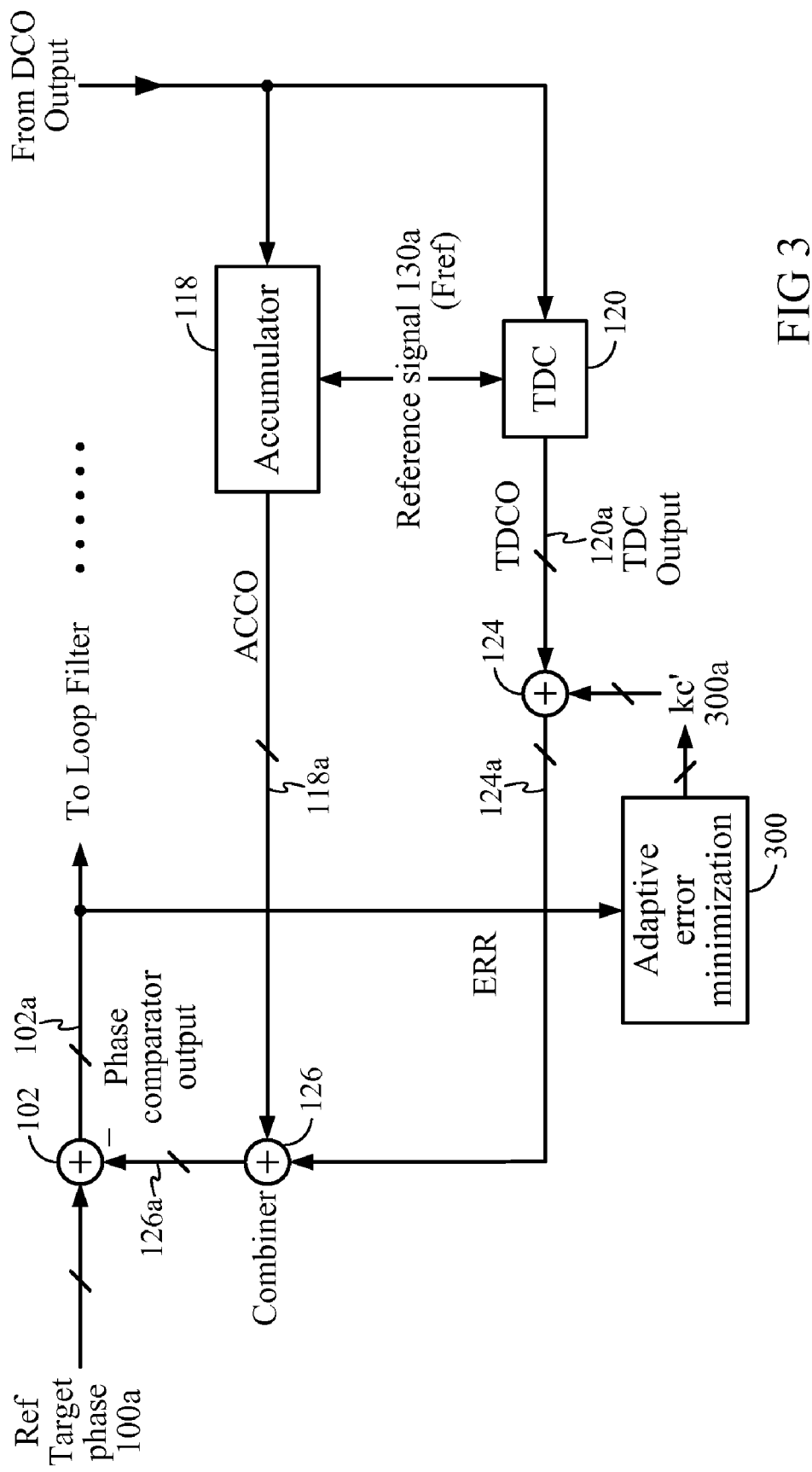
FIG. 3 depicts an exemplary embodiment according to the present disclosure, wherein the TDC output signal 120*a* is multiplied by an adaptive calibration factor kc'.

FIG. 3 depicts an exemplary embodiment according to the present disclosure, wherein the TDC output signal 120*a* is multiplied by an adaptive calibration factor kc'. In FIG. 3, an adaptive error minimization block 300 is configured to minimize a magnitude function of the phase comparator output signal 102*a* by adjusting the value of kc'. As the phase comparator output signal 102*a* represents the error difference between the target phase 100*a* and the quantized and calibrated version 126*a* of the accumulated DCO output phase, the signal 102*a* is an error signal that may be used to drive any of a variety of error minimization algorithms known to one of ordinary skill in the art.

Note the adaptive error minimization block 300 may generally receive additional input signals not shown in FIG. 3. For example, in an exemplary embodiment later described hereinbelow, the adaptive error minimization block 300 may also accept the TDC output signal 120*a* as an input signal.

In an exemplary embodiment, the adaptive minimization algorithm block 300 may be implemented based on a version of the least-mean squares (LMS) algorithm, for example. The LMS algorithm may be configured to minimize the mean-squared value of the phase comparator output signal 102*a*, according to the following formulation, wherein ERR= [phase comparator output signal 102*a*], REF=[target phase 100*a*], TDCO=[TDC output signal 120*a*], and ACCO=[Accumulator output signal 118*a*]:

$$\min_{kc'} E[ERR^2] = \min_{kc'} E[(REF - (ACCO + TDCO \cdot kc'))^2]. \quad \text{(Equation 1)}$$

According to the above formulation, the recursive LMS algorithm may be implemented as follows:

$$kc'(n) = kc'(n-1) + \mu \cdot ERR \cdot TDCO; \quad \text{(Equation 2)}$$

wherein n is a time index, and $\mu$ represents an adaptation factor controlling the speed of adaptation. In an exemplary embodiment, $\mu$ may be chosen to make the LMS adaptation significantly slower than the main DPLL loop, whose speed is controlled in part by the loop filter 106. For example, $\mu$ may correspond to a time constant much longer than the time constant of the main DPLL loop. Equivalently, $\mu$ may correspond to a bandwidth of the adaptation loop that is much narrower than the bandwidth of the main DPLL loop. In an exemplary embodiment, $\mu$ may correspond to a time constant on the order of five to ten times longer than the time constant of the main DPLL loop.

Figure 4:
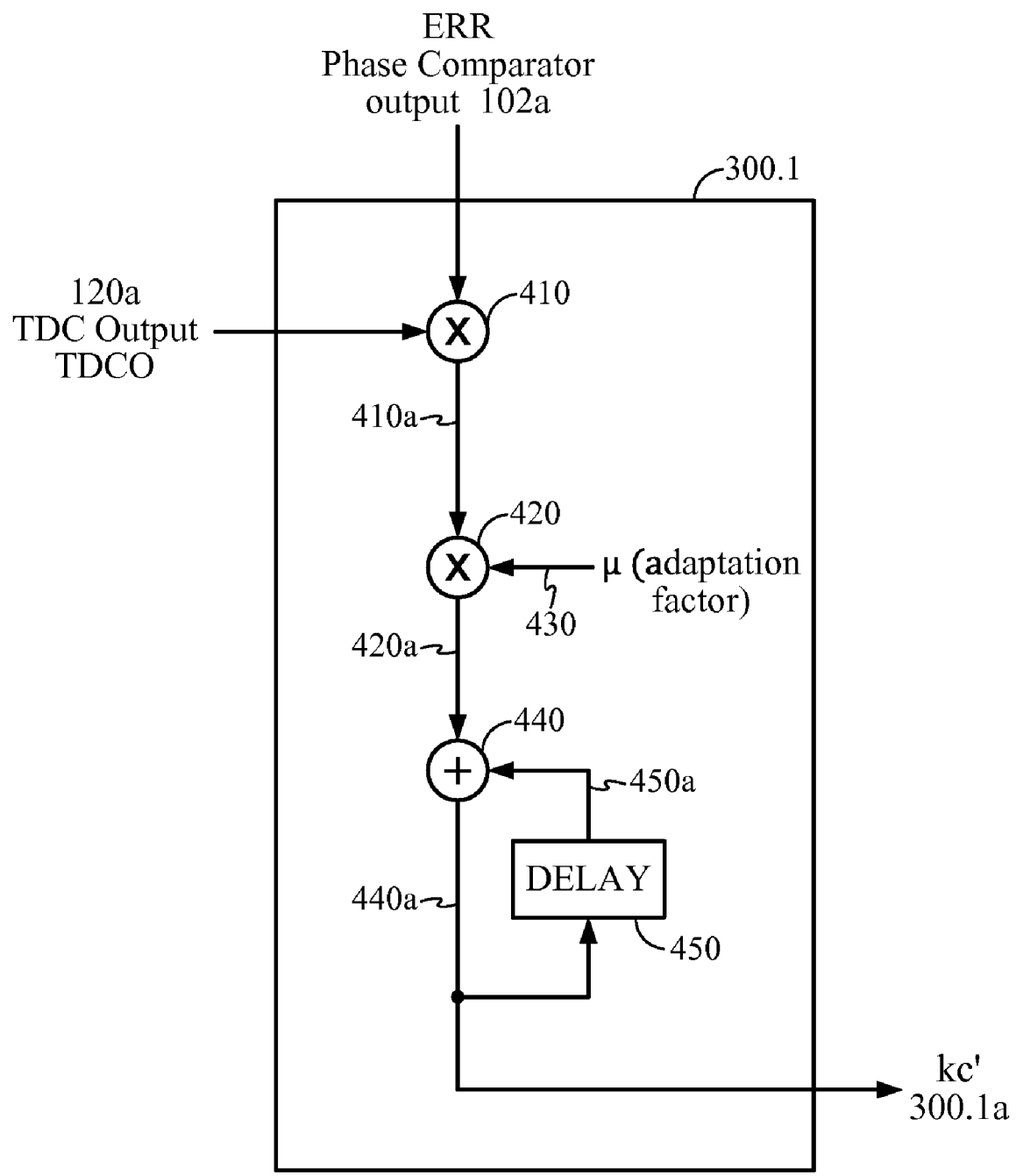
FIG. 4 depicts an exemplary embodiment 300.1 of the adaptive error minimization block 300 using the algorithm described in Equation 2.

FIG. 4 depicts an exemplary embodiment 300.1 of an adaptive error minimization block 300 for implementing the algorithm described in Equation 2. Note the exemplary embodiment described with reference to FIG. 4 is shown for illustrative purposes only, and is not meant to limit the adaptive algorithm for computing kc' to any exemplary embodiment explicitly described herein. The algorithm may be implemented in hardware, software, or using any other techniques known to one of ordinary skill in the art.

In FIG. 4, the phase comparator output signal 102*a* (ERR) and the TDC output signal 120*a* (TDCO) are multiplied 410. The result 410*a* is multiplied 420 by $\mu$ 430, i.e., the adaptation factor. The result 420*a* is then recursively accumulated 440 with delayed 450 versions 450*a* of signal 440*a* to produce a current result 440*a*. The result 440*a* is output by the block 300.1 as the adaptive calibration factor kc' 300.1*a*.

Figure 5:
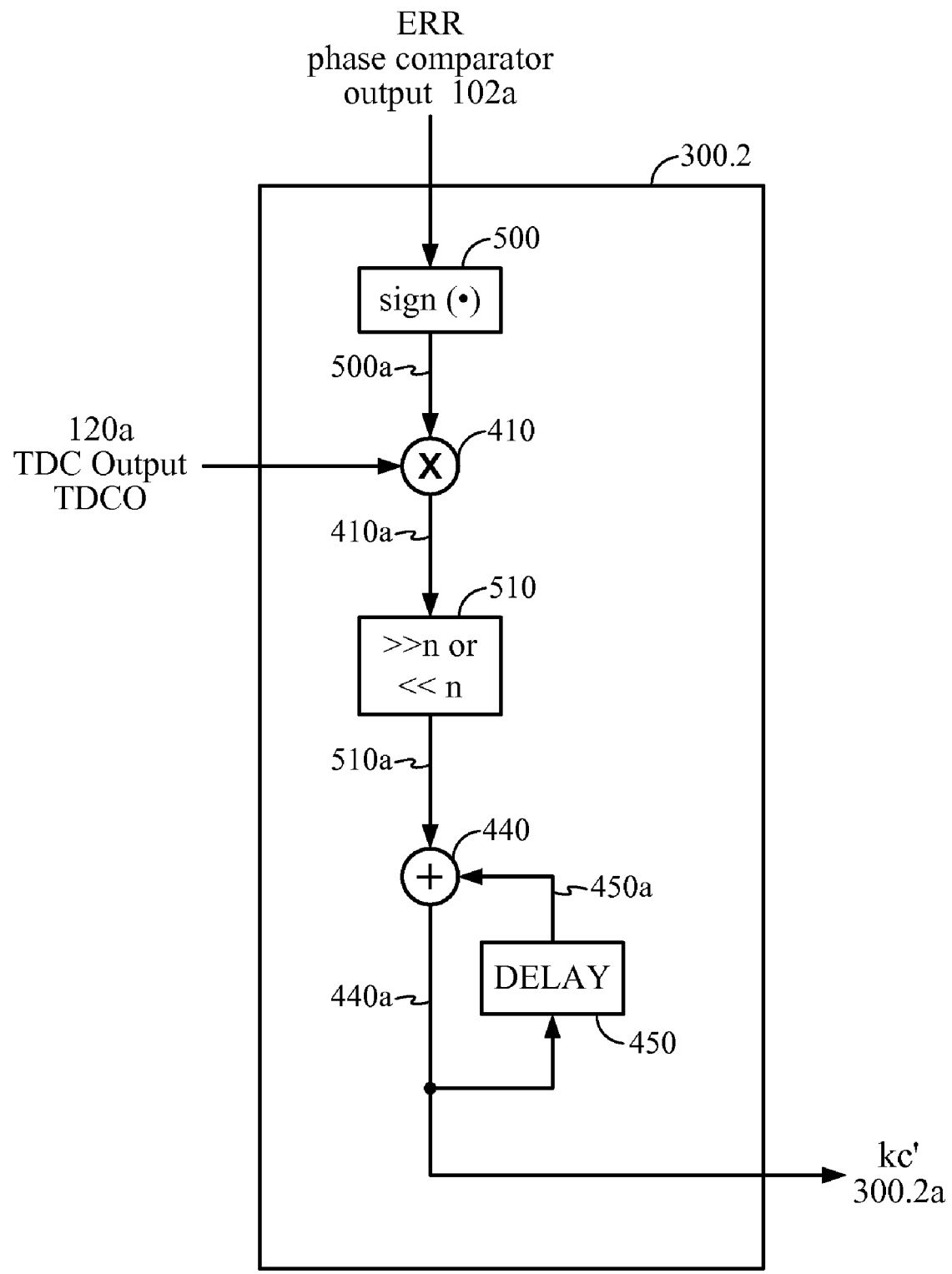
FIG. 5 depicts a computationally simplified exemplary embodiment 300.2 of the adaptive error minimization block 300.1.

FIG. 5 depicts a computationally simplified exemplary embodiment 300.2 of the adaptive error minimization block 300.1 depicted in FIG. 4. In FIG. 5, the phase comparator output signal 102*a* (ERR) is first applied to a signum function block sign(•) 500 before being multiplied 410 with the TDC output signal 120*a* (TDCO). The signum function block 500 may perform the following mapping:

$$\text{sign}(x) = 1 \text{ if } x > 0; \quad \text{(Equation 3)}$$
$$0 \text{ if } x = 0; \text{ and}$$
$$-1 \text{ if } x < 0.$$

One of ordinary skill in the art will appreciate that the signum function block 500 simplifies the implementation of the multiplier 410, while modifying the speed of the adaptation versus Equation 2.

As further illustrated in FIG. 5, the multiplication by adaptation factor $\mu$ is effectively implemented as a bit-shifting operation 510, wherein a binary representation of the signal 410*a* is right-shifted or left-shifted by n bits. This restricts the possible values of to integer powers of 2, and greatly simplifies the implementation of multiplier 420. In an exemplary embodiment, $\mu$ may take on values such as $2^{-10}$, $2^{-11}$, or $2^{-12}$, corresponding to right-shifting the binary representation of the signal 410*a* by 10, 11, or 12 bits, respectively.

One of ordinary skill in the art will appreciate that the exemplary embodiments depicted in FIGS. 4 and 5 are not meant to limit the scope of the adaptive error minimization block 300 to algorithms employing LMS. For example, the adaptive error minimization block 300 may seek to minimize magnitude functions of the phase comparator output signal 102*a* other than the mean-square value. For example, an adaptive error minimization block 300 may seek to minimize the absolute value of the phase comparator output signal. Alternative exemplary embodiments may implement a recursive-least squares (RLS) algorithm, neural network techniques, H-infinity methods, or any other adaptive algorithms known to one of ordinary skill in the art. Such exemplary embodiments are contemplated to be within the scope of the present disclosure.

Note in an exemplary embodiment, the techniques of the present disclosure may be applied while the DPLL output signal is modulated using the two-point modulation (TPM) techniques described with reference to FIG. 1. In an exemplary embodiment, TPM supports a modulation bandwidth far exceeding the loop bandwidth of the DPLL.

Figure 6:
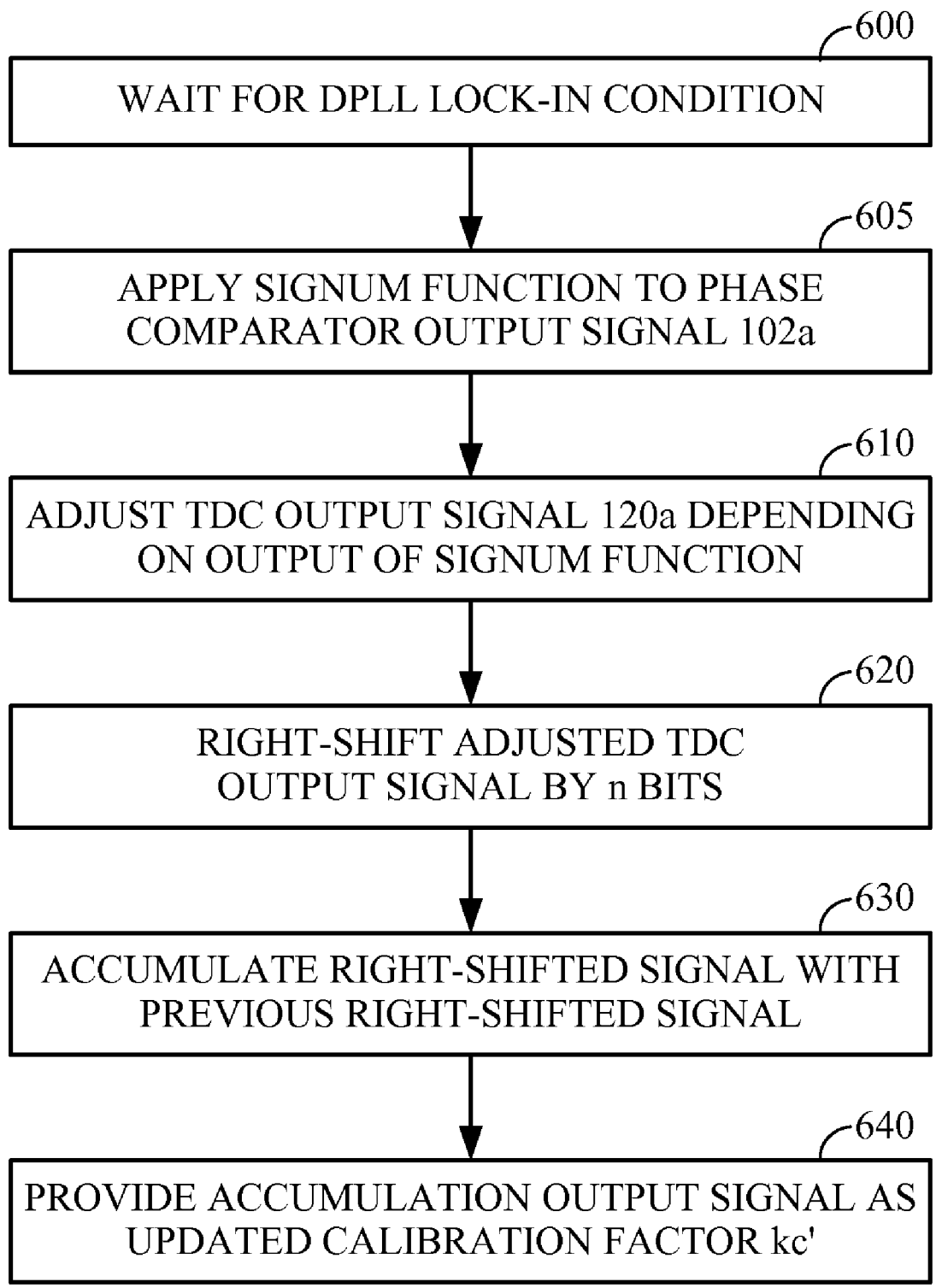
FIG. 6 depicts an exemplary embodiment of a method according to the present disclosure for computing the calibration factor kc' to improve DPLL performance.

FIG. 6 depicts an exemplary embodiment of a method according to the present disclosure for computing the calibration factor kc' to improve DPLL performance. Note FIG. 6 is provided for illustrative purposes only, and is not meant to limit the scope of the present disclosure to any particular method disclosed.

In FIG. 6, at step 600, the method waits for a lock-in condition of the DPLL. In an exemplary embodiment, this may correspond to waiting a predetermined amount of time following loop start-up. In an exemplary embodiment, the predetermined amount of time may be the time required for the DPLL to lock onto a selected frequency following loop start-up.

At step 605, the signum function is applied to a phase comparator output signal 102*a*, which may be generated as earlier described with reference to FIGS. 1 and 5.

At step 610, the TDC output signal 120a is adjusted depending on the output of the signum function computed at step 600. In an exemplary embodiment, the adjustment can be a multiplication.

At step 620, the adjusted TDC output signal is right-shifted by n bits. In an alternative exemplary embodiment (not shown), the right-shifting may be replaced by standard multiplication for greater flexibility.

At step 630, the right-shifted signal from step 620 is accumulated with a previous right-shifted signal.

At step 640, the output signal of step 630 may be provided as the updated calibration factor kc'.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for improving the performance of a digital phase-locked loop (DPLL), the method comprising:
adjusting a calibration factor to decrease a magnitude function of a phase comparator output signal via an error minimization algorithm that accepts the phase comparator output signal as input, wherein the DPLL comprises:
a time-to-digital converter (TDC) for providing a digital representation of the duration of an interval spanning an event in an output signal and an event in a reference signal, wherein the digital representation is adjusted by the calibration factor to generate a calibrated TDC output signal; and
a comparator for comparing a target phase with an accumulated phase of the output signal to generate the phase comparator output signal, the accumulated phase of the output signal comprising the calibrated TDC output signal.

2. The method of claim 1, the magnitude function being a mean-squared value.

3. The method of claim 1, the magnitude function being an absolute value.

4. The method of claim 1, the magnitude function being a maximum of the absolute value over time.

5. The method of claim 1, the event in the reference signal being a rising edge, and the event in the output signal being a rising edge immediately preceding the corresponding rising edge in the reference signal.

6. The method of claim 1, the accumulated phase of the output signal further comprising an integer portion of the accumulated phase of the output signal, the calibrated TDC output signal comprising the fractional portion of the accumulated phase of the output signal.

7. The method of claim 1, the adjusting the calibration factor comprising:
  multiplying the digital representation of the duration of the interval with a signal derived from the phase comparator output signal to generate a multiplier output signal;
  multiplying the multiplier output signal with an adaptation factor to generate a weighted factor;
  adding the weighted factor to a previous version of the weighted factor to generate an accumulated output signal; and
  providing the accumulated output signal as the calibration factor.

8. The method of claim 7, the signal derived from the phase comparator output signal comprising the phase comparator output signal applied to a signum function.

9. The method of claim 7, the multiplying the multiplier output signal with an adaptation factor comprising shifting the digital representation of the multiplier output signal by a number of bits.

10. The method of claim 9, the shifting comprising right-shifting.

11. The method of claim 10, further comprising modulating the DPLL output signal with a modulating signal.

12. The method of claim 1, further comprising waiting for a lock-in condition of the DPLL prior to the adjusting.

13. The method of claim 12, the waiting for a lock-in condition comprising waiting for a predetermined time interval.

14. A digital phase-locked loop (DPLL) comprising:
  a time-to-digital converter (TDC) for providing a digital representation of the duration of an interval spanning an event in an output signal and an event in a reference signal, the digital representation adjusted by a calibration factor to generate a calibrated TDC output signal;
  a comparator for comparing a target phase with an accumulated phase of the output signal to generate a phase comparator output signal, the accumulated phase of the output signal comprising the calibrated TDC output signal; and
  an adaptive error minimization block configured to adjust the calibration factor to decrease a magnitude function of the phase comparator output signal via an error minimization algorithm that accepts the phase comparator output signal as input.

15. The DPLL of claim 14, the magnitude function of the phase comparator output signal comprising the mean-squared value of the phase comparator output signal.

16. The DPLL of claim 14, the magnitude function of the phase comparator output signal comprising the maximum of the absolute value of the phase comparator output signal over time.

17. The DPLL of claim 14, the event in the reference signal being a rising edge, and the event in the output signal being a rising edge immediately preceding the corresponding rising edge in the reference signal.

18. The DPLL of claim 14, the accumulated phase of the output signal further comprising an integer portion of the accumulated phase of the output signal, the calibrated TDC output signal comprising the fractional portion of the accumulated phase of the output signal.

19. The DPLL of claim 14, the adaptive error minimization block comprising:
  a multiplier multiplying the digital representation of the duration of the interval with a signal derived from the phase comparator output signal to generate a multiplier output signal;
  a multiplier multiplying the multiplier output signal with an adaptation factor to generate a weighted factor; and
  an adder adding the weighted factor to a previous version of the weighted factor to generate an accumulated output signal;
  the accumulated output signal being the adjusted calibration factor.

20. The DPLL of claim 19, the signal derived from the phase comparator output signal comprising the phase comparator output signal applied to a signum function.

21. The DPLL of claim 19, the multiplier multiplying the multiplier output signal with an adaptation factor comprising a bit-shifter shifting the digital representation of the multiplier output signal by a number of bits.

22. The DPLL of claim 21, the bit-shifter right-shifting by a number of bits.

23. The DPLL of claim 22, further comprising a modulator modulating the DPLL output signal with a modulating signal.

24. The DPLL of claim 14, the adaptive error minimization block further configured to adjust the calibration factor after a lock-in condition of the DPLL.

25. The DPLL of claim 24, the lock-in condition of the DPLL comprising the elapsing of a predetermined amount of time after the DPLL is switched to a new output frequency.

26. A digital phase-locked loop (DPLL) comprising:
  a time-to-digital converter (TDC) for providing a digital representation of the duration of an interval spanning an event in an output signal and an event in a reference signal, the digital representation adjusted by a calibration factor to generate a calibrated TDC output signal;
  a comparator for comparing a target phase with an accumulated phase of the output signal to generate a phase comparator output signal, the accumulated phase of the output signal comprising the calibrated TDC output signal; and
  means for adaptively decreasing a magnitude function of the phase comparator output signal via an error minimization algorithm that accepts the phase comparator output signal as input.

27. A computer program product for improving the performance of a digital phase-locked loop (DPLL), wherein the computer program product comprises a non-transitory computer-readable medium comprising:
  code for causing a computer to adjust a calibration factor to decrease a magnitude of a phase comparator output signal via an error minimization algorithm that accepts the phase comparator output signal as input, the DPLL comprising a time-to-digital converter (TDC) for providing a digital representation of the duration of an interval spanning an event in an output signal and an event in a reference signal, the digital representation adjusted by the calibration factor to generate a calibrated TDC output signal, the DPLL further comprising a comparator for comparing a target phase with an accumulated phase of the output signal to generate the phase comparator output signal, the accumulated phase of the output signal comprising the calibrated TDC output signal.

28. The computer program product of claim 27, the non-transitory computer-readable medium further comprising:

code for causing a computer to multiply the digital representation of the duration of the interval with a signal derived from the phase comparator output signal to generate a multiplier output signal;

code for causing a computer to multiply the multiplier output signal with an adaptation factor to generate a weighted factor;

code for causing a computer to add the weighted factor to a previous version of the weighted factor to generate an accumulated output; and code for causing a computer to provide the accumulated output as the calibration factor.

* * * * *